United States Patent
Beaupre et al.

(10) Patent No.: US 8,929,071 B2
(45) Date of Patent: Jan. 6, 2015

(54) LOW COST MANUFACTURING OF MICRO-CHANNEL HEATSINK

(75) Inventors: Richard Alfred Beaupre, Pittsfield, MA (US); Ljubisa Dragoljub Stevanovic, Clifton Park, NY (US); Daniel Jason Erno, Clifton Park, NY (US); Charles Gerard Woychik, Niskayuna, NY (US)

(73) Assignee: General Electric Company, Niskayuna, NY (US)

( * ) Notice: Subject to any disclaimer, the term of this patent is extended or adjusted under 35 U.S.C. 154(b) by 826 days.

(21) Appl. No.: 12/317,361

(22) Filed: Dec. 22, 2008

(65) Prior Publication Data
US 2010/0157526 A1   Jun. 24, 2010

(51) Int. Cl.
| H02B 1/00 | (2006.01) |
| H05K 7/20 | (2006.01) |
| H01L 23/34 | (2006.01) |
| H01L 23/473 | (2006.01) |

(52) U.S. Cl.
CPC ..... *H01L 23/473* (2013.01); *H01L 2924/09701* (2013.01)
USPC ........... 361/699; 361/689; 361/676; 361/677; 257/712; 174/15.2; 174/16.3

(58) Field of Classification Search
USPC .............. 316/699–706, 715–719, 679.52, 316/679.53, 679.54; 257/712–722; 174/15.2, 16.3, 252; 361/699–706, 361/715–719, 679.52, 679.53, 679.54; 165/104.33
See application file for complete search history.

(56) References Cited

U.S. PATENT DOCUMENTS

| 5,057,908 | A | 10/1991 | Weber .............................. 357/81 |
| 5,218,515 | A | 6/1993 | Bernhardt |
| 5,533,256 | A | 7/1996 | Call et al. ......................... 29/840 |
| 5,892,279 | A | 4/1999 | Nguyen ....................... 257/712 |
| 7,019,975 | B2 | 3/2006 | Nagatomo et al. ............ 361/704 |
| 7,190,580 | B2 | 3/2007 | Bezama et al. ............... 361/699 |
| 7,353,859 | B2 * | 4/2008 | Stevanovic et al. .......... 165/80.4 |
| 7,429,502 | B2 | 9/2008 | Archer, III et al. ........... 438/122 |
| 2006/0108098 | A1 | 5/2006 | Stevanovic et al. |
| 2007/0215325 | A1 | 9/2007 | Solovitz et al. .............. 165/80.4 |
| 2009/0101308 | A1 * | 4/2009 | Hardesty ...................... 165/80.4 |

FOREIGN PATENT DOCUMENTS

| EP | 1796138 A2 | 6/2007 |
| EP | 1808892 A2 | 7/2007 |

OTHER PUBLICATIONS

Harpole et al., "Micro-Channel Heat Exchanger Optimization", Semiconductor Thermal Measurement and Management Symposium, Scottsdale, AZ, Annual Semiconductor Thermal and Temperature Measurement Symposium, vol. Symp. 7, pp. 59-63, Feb. 12, 1991.
European Search Report dated Jun. 9, 2010.

* cited by examiner

*Primary Examiner* — Jerry Wu
(74) *Attorney, Agent, or Firm* — John P. Darling

(57) ABSTRACT

A cooling device includes a ceramic substrate with a metal layer bonded to an outer planar surface. The cooling device also includes a channel layer bonded to an opposite side of the ceramic substrate and a manifold layer bonded to an outer surface of the channel layer. The substrate layers are bonded together using a high temperature process such as brazing to form a single substrate assembly. A plenum housing is bonded to the single substrate assembly via a low temperature bonding process such as adhesive bonding and is configured to provide extended manifold layer inlet and outlet ports.

22 Claims, 4 Drawing Sheets

LOW COST MANUFACTURING OF MICRO-CHANNEL HEATSINK

BACKGROUND

The invention relates generally to an apparatus for cooling a heated surface and, more particularly, to a heat sink with channel-type cooling for semiconductor power devices.

The development of higher-density power electronics has made it increasingly more difficult to cool power semiconductor devices. With modern silicon-based power devices capable of dissipating up to 500 W/cm$^2$, there is a need for improved thermal management solutions. When device temperatures are limited to 50 K increases, natural and forced air cooling schemes can only handle heat fluxes up to about one (1) W/cm$^2$. Conventional liquid cooling plates can achieve heat fluxes on the order of a twenty (20) W/cm$^2$. Heat pipes, impingement sprays, and liquid boiling are capable of larger heat fluxes, but these techniques can lead to manufacturing difficulties and high cost.

An additional problem encountered in conventional cooling of high heat flux power devices is non-uniform temperature distribution across the heated surface. This is due to the non-uniform cooling channel structure, as well as the temperature rise of the cooling fluid as it flows through long channels parallel to the heated surface.

One promising technology for high performance thermal management is micro-channel cooling. In the 1980's, it was demonstrated as an effective means of cooling silicon integrated circuits, with designs demonstrating heat fluxes of up to 1000 W/cm$^2$ and surface temperature rise below 100° C. Known micro-channel designs require soldering a substrate (with micro-channels fabricated in the bottom copper layer) to a metal-composite heat sink that incorporates a manifold to distribute cooling fluid to the micro-channels. Further, these known micro-channel designs employ very complicated backside micro-channel structures and heat sinks that are extremely complicated to build and therefore very costly to manufacture.

In view of the foregoing, it would be desirable to provide a channel-type heat sink cooling structure that is relatively simple to assemble and that does not compromise cooling-channel features in subsequent processing operations following construction of substrate cooling-channels.

BRIEF DESCRIPTION

Briefly, in accordance with one embodiment, a cooling device comprises:
a substrate assembly comprising:
a ceramic layer comprising a first planar surface and a second planar surface substantially parallel to the first planar surface;
a metal layer bonded to the first planar surface;
a channel layer bonded to the second planar surface; and
a manifold layer bonded to a surface of the channel layer opposite the second planar surface, the substrate layers configured together as a single unitary substrate; and
a plenum housing bonded to the substrate assembly and configured to provide manifold layer inlet and outlet ports.

According to another embodiment, a method of manufacturing a cooling device comprises:
providing a first ceramic substrate;
bonding a first metal layer to one side of the first ceramic substrate;
bonding a first side of a first channel layer to an opposite side of the first ceramic substrate; and
bonding a first manifold layer to a second side of the first channel layer opposite the first side of the first channel layer, such that the first ceramic substrate, first metal layer, first channel layer and the first manifold layer bonded together form a first substrate assembly.

DRAWINGS

These and other features, aspects, and advantages of the present invention will become better understood when the following detailed description is read with reference to the accompanying drawings in which like characters represent like parts throughout the drawings, wherein.

While the above-identified drawing figures set forth alternative embodiments, other embodiments of the present invention are also contemplated, as noted in the discussion. In all cases, this disclosure presents illustrated embodiments of the present invention by way of representation and not limitation. Numerous other modifications and embodiments can be devised by those skilled in the art which fall within the scope and spirit of the principles of this invention.

DETAILED DESCRIPTION

Figure 1:
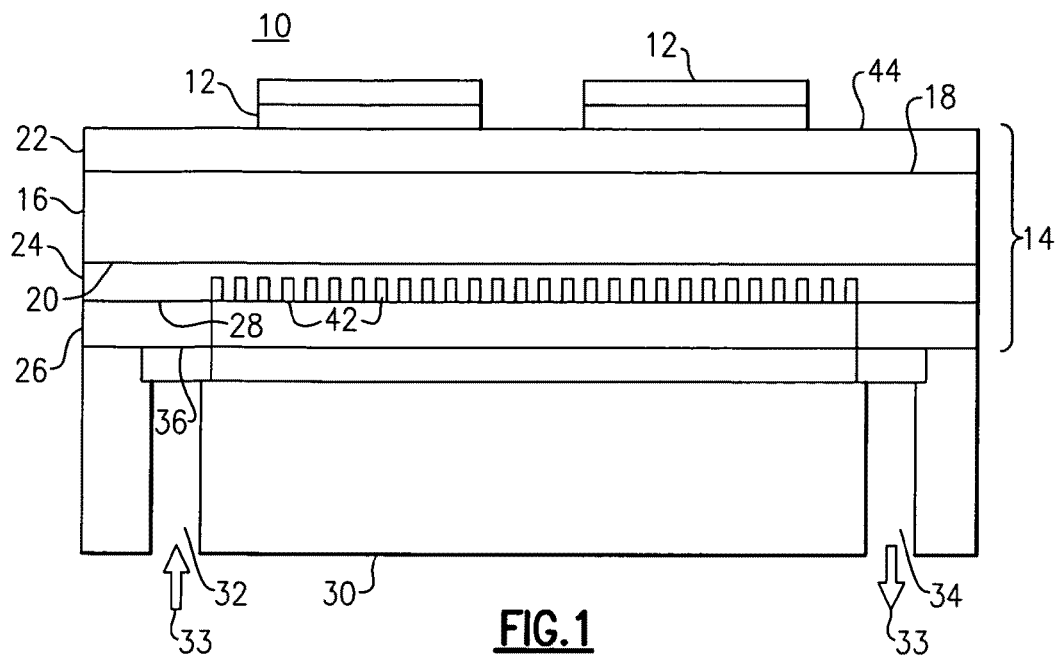
FIG. 1 illustrates an apparatus for cooling a power device in side view according to one embodiment of the invention.

FIG. 1 illustrates a heat sink assembly 10 for cooling at least one power device 12 in side view according to one embodiment of the invention. Heat sink assembly 10 includes a substrate 14 that comprises a ceramic layer 16 having a first planar surface 18 and a second planar surface 20 substantially parallel to the first planar surface 18. Substrate 14 further comprises a metal layer 22 that is metallurgically bonded to the first planar surface 18, a channel layer 24 that is metallurgically bonded to the second planar surface 20 and a manifold layer 26 that is metallurgically bonded to a surface 28 of the channel layer 24 opposite the second planar surface 20. A base plate/plenum housing 30 that includes at least one inlet port 32 and at least one outlet port 34 is bonded to a surface 36 of the manifold layer 26 opposite the channel layer surface 26 and is configured to provide extended manifold layer inlet and outlet ports.

Heat sink assembly 10, according to one embodiment, comprises a metal layer 22 having a thickness of about 0.3 mm, a channel layer 24 thickness of about 0.3 mm and a manifold layer 26 thickness of about 0.3 mm. According to another embodiment, heat sink assembly 10 includes metal layer 22 having a thickness of about 0.3 mm, a channel layer 24 thickness of about 0.15 mm and a manifold layer 26 thickness of about 0.15 mm. According to yet another embodiment, heat sink assembly 10 includes metal layer 22 having a thickness of about 0.6 mm, a channel layer 24 thickness of about 0.3 mm and a manifold layer 26 thickness of about 0.3 mm.

Figure 5:
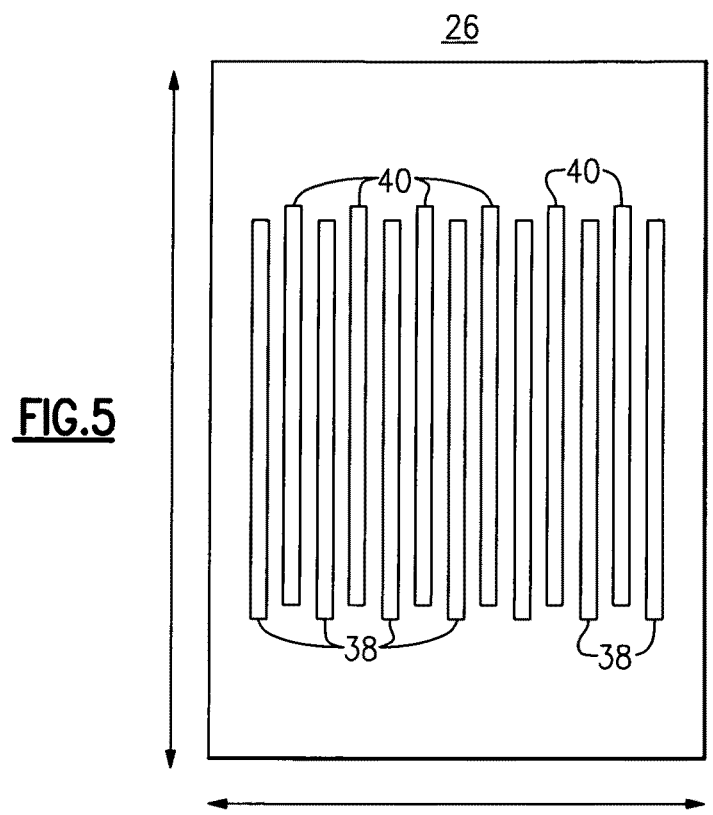
FIG. 5 is a plan view of the manifold layer depicted in FIG. 1 according to one embodiment.

A plan view of manifold layer 26 shown in FIG. 5, defines a number of inlet manifolds 38 and a number of outlet manifolds 40. The inlet manifolds 38 are configured to receive a coolant, and the outlet manifolds 40 are configured to exhaust the coolant. In one embodiment the inlet and outlet manifolds 38, 40 are interleaved as indicated in FIG. 5.

Figure 4:
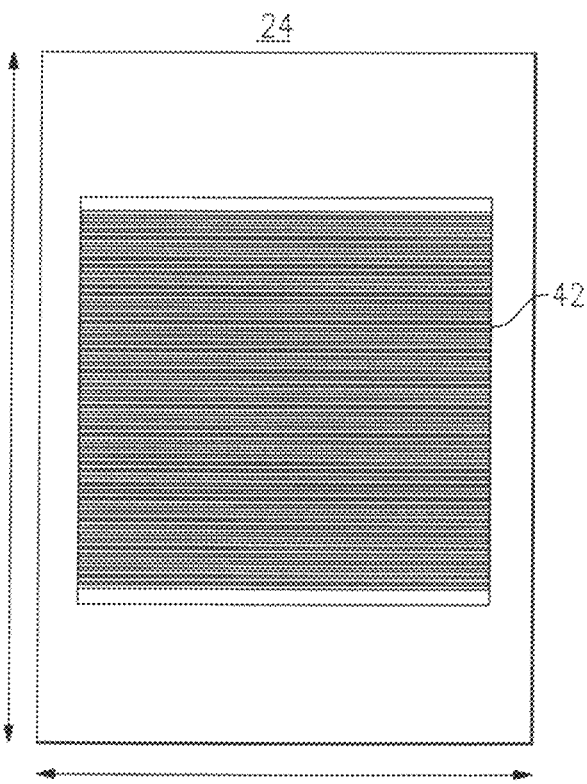
FIG. 4 is a plan view of the channel layer depicted in FIG. 1 according to one embodiment.

A plan view of channel layer 24 shown in FIG. 4 features a number of channels 42 configured to receive a coolant from inlet manifolds 38 and to deliver the coolant to outlet manifolds 40. Channels 42 are oriented substantially perpendicular to inlet and outlet manifolds 38, 40 according to one aspect of the invention.

With continued reference to FIG. 1, the outer surface 44 of substrate 14 is in thermal contact with at least one power device 12. Heat sink assembly 10 further includes an inlet plenum 32 configured to supply a coolant 33 to inlet manifolds 38 and an outlet plenum 34 configured to exhaust the coolant 33 from outlet manifolds 40.

The ceramic layer 16 may be formed of, for example, aluminum-oxide ($AL_2O_3$), aluminum nitride (AIN), beryllium oxide (BeO) and silicon nitride (Si3N4). Other similar ceramic materials may also be employed so long as the ceramic material can be metallurgically bonded with the top metal layer 22 and the channel layer 24.

Figure 2:
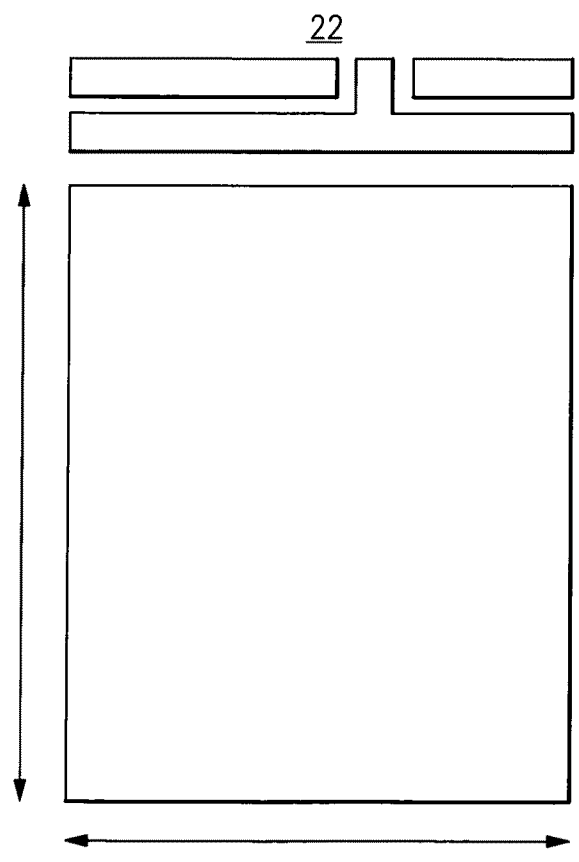
FIG. 2 is a plan view of the top copper layer depicted in FIG. 1 according to one embodiment.

FIG. 2 is a plan view of the metal layer 22 depicted in FIG. 1 according to one embodiment. Metal layer 22 may be, for example, a direct bond copper (DBC) or active metal braze (AMB) layer that is bonded to the ceramic layer 16.

Figure 3:
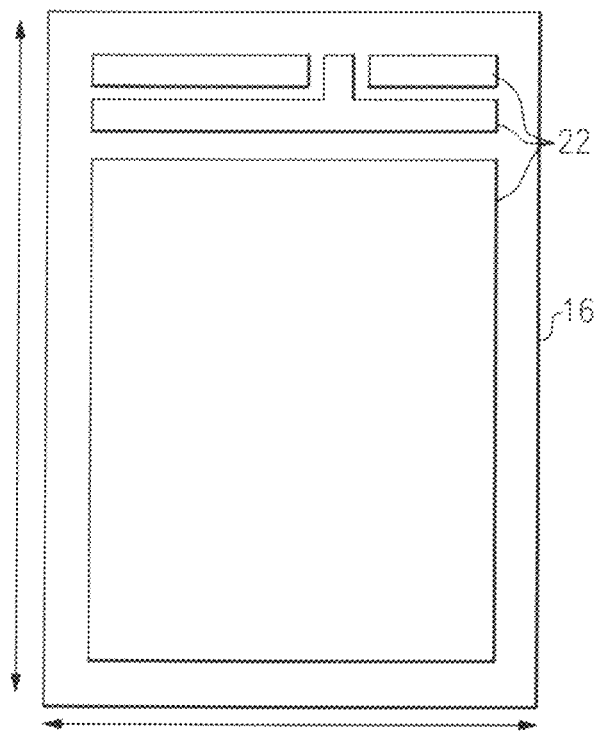
FIG. 3 is a plan view of the top copper layer depicted in FIG. 1 deposited on a substrate according to one embodiment.

FIG. 3 is a plan view of the top copper layer 22 depicted in FIG. 1 bonded to a layer of ceramic 16 according to one embodiment.

FIG. 4 is a plan view of the channel layer 24 depicted in FIG. 1 illustrating a plurality of channels 42 according to one embodiment. The channel layer 24 may comprise channel geometries that encompass micro-channel dimensions to milli-channel dimensions. Channels 42 may have, for example, a feature size of about 0.05 mm to about 5.0 mm according to some aspects of the invention. Exemplary channel 42 configurations may be formed of continuous microchannels extending along the substrate 14. According to another embodiment, channels 42 are about 0.1 mm wide and are separated by a number of gaps of about 0.2 mm. According to yet another embodiment, channels 42 are about 0.3 mm wide and are separated by a number of gaps of about 0.5 mm. According to still another embodiment, channels 42 are about 0.6 mm wide and are separated by a number of gaps of about 0.8 mm.

FIG. 5 is a plan view of the manifold layer 26 depicted in FIG. 1 according to one embodiment. The manifolds 38, 40 are configured to run perpendicular to the channels 42 depicted in FIG. 4 according to one aspect of the invention.

Figure 6:
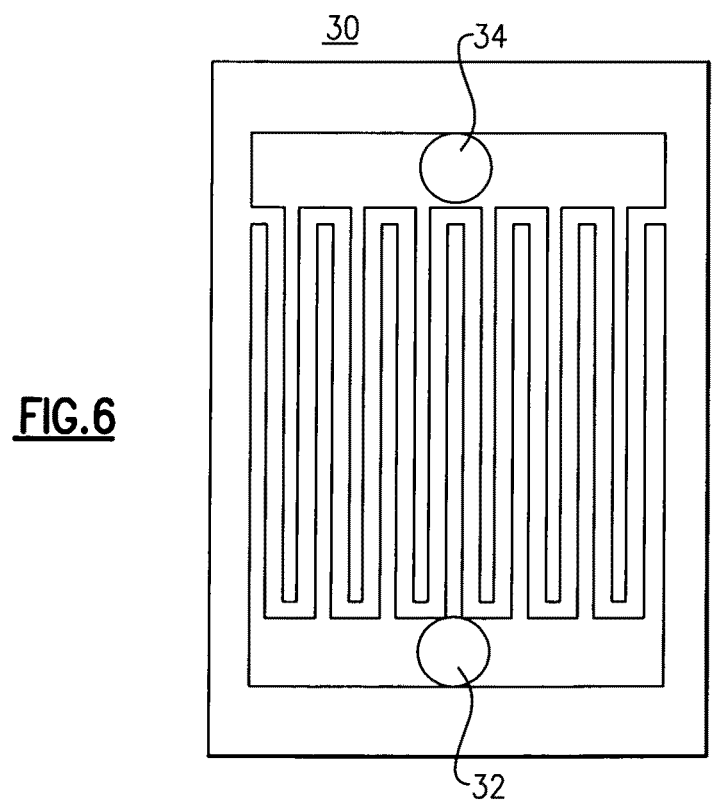
FIG. 6 is a plan view of the base plate depicted in FIG. 1 according to one embodiment.

FIG. 6 is a plan view of the base plate 30 depicted in FIG. 1 according to one embodiment. According to particular embodiments, base plate/plenum housing 30 comprises a castable metal and/or, for example, a moldable plastic, ceramic, machinable ceramic, or machinable glass-ceramic structure. The embodiments described herein are not limited to specific base plate/housing materials. The base plate 30 is bonded to the manifold layer 26 via an adhesive bond according to one aspect of the invention.

Figure 7:
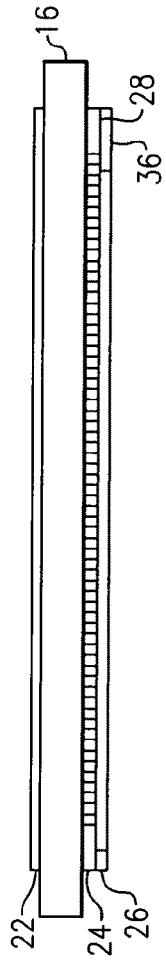
FIG. 7 illustrates a unitary substrate assembly that includes a top copper layer, a channel layer and a manifold layer according to one embodiment.

FIG. 7 illustrates a unitary substrate assembly 14 that includes a top metal layer 22, a ceramic layer 16, a channel layer 24 and a manifold layer 26 according to one embodiment. According to particular embodiments, substrate 14 includes either a direct bonded copper (DBC), or an active metal braze (AMB) structure to implement the metal layer 22. DBC and AMB refer to processes by which copper layers are directly bonded to a ceramic substrate. Exemplary ceramic materials include aluminum-oxide ($AL_2O_3$), aluminum nitride (AIN), beryllium oxide (BeO) and silicon nitride (Si3N4). Both DBC and AMB are convenient structures for substrate 14, and the use of the same conductive material (in this case, copper) on both sides of the ceramic layer 16 provides thermal and mechanical stability. Of course substrate 14 can be constructed from other materials, such as gold or silver. Beneficially, the substrate 14 can be attached to base plate/housing 30 illustrated in FIG. 8 using any one of a number of solderless techniques, including bonding, diffusion bonding, or pressure contact such as clamping. This provides a simple assembly process, which reduces the overall cost of the heat sink apparatus 10. Moreover, by attaching the substrate 14 to base plate/housing 30, fluid passages are formed under the power device 12 surfaces depicted in FIG. 1, enabling practical and cost effective implementation of the channel cooling technology.

With continued reference to FIG. 7, substrate assembly 14 that includes a top metal layer 22, a ceramic layer 16, a channel layer 24 and a manifold layer 26 is implemented according to one aspect of the invention by using a high temperature brazing process that avoids contamination or damage to the channel layer channels 42 generally associated with soldering techniques. Further, the materials and thicknesses of the substrate layers 16, 22, 24, 26 can be closely controlled to prevent undesired interactions between the layers during heating and cooling processing steps. In this manner, the finer features associated with the channel layer 24 can be protected from damage during the manufacturing process; and the substrate assembly 14 features can be formed with a high degree of certainty.

Figure 8:
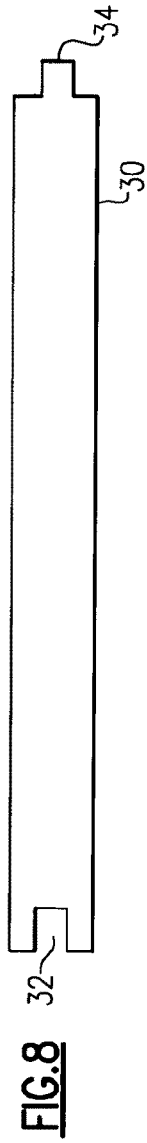
FIG. 8 illustrates a unitary base plate that is suitable for use with the unitary substrate assembly depicted in FIG. 7 according to one embodiment.

FIG. 8 illustrates a unitary base plate 30 that is suitable for use with the unitary substrate assembly 14 depicted in FIG. 7 according to one embodiment. Base plate 30 includes fluidic passages that mirror the manifold passages 38, 40 associated with the manifold layer 26 according to one embodiment. Base plate/housing 30 further includes at least one inlet port 32 and at least one outlet port 34 and is bonded to a surface 36 of the manifold layer 26 opposite the channel layer surface 28 to provide extended manifold layer 26 inlet and outlet ports, as stated above. Since base plate 30 is only required to provide a means to transfer cooling fluid, base plate 30 need not be constructed from a metal that is suitable to provide a means of heat transfer. The actual heat transfer process is instead achieved from the metallurgical bonds between the substrate layers.

Manifold passages 38, 40 are larger in cross-section than that associated with the channels 42 according to one aspect of the invention in order to provide a desired high level of cooling capacity for the substrate assembly 14. Many coolants can be employed for cooling assembly 10, and the embodiments are not limited to a particular coolant 33. Exemplary coolants 33 include water, ethylene-glycol, oil, aircraft fuel and combinations thereof. According to a particular embodiment, the coolant 33 is a single phase liquid. In operation, the coolant 33 enters the manifolds 38 via base plate inlet port 32 and flows through channels 42 before returning via base plate outlet port 34 through exhaust manifolds 40.

As shown in FIG. 1, the channels 42 do not extend through channel layer 24, in order to isolate the coolant from the heated surface of the power device 12, according to one embodiment. More particularly, the ceramic layer 16 acts as a dielectric barrier between power devices 12 atop substrate 14 and the coolant 33.

Figure 9:
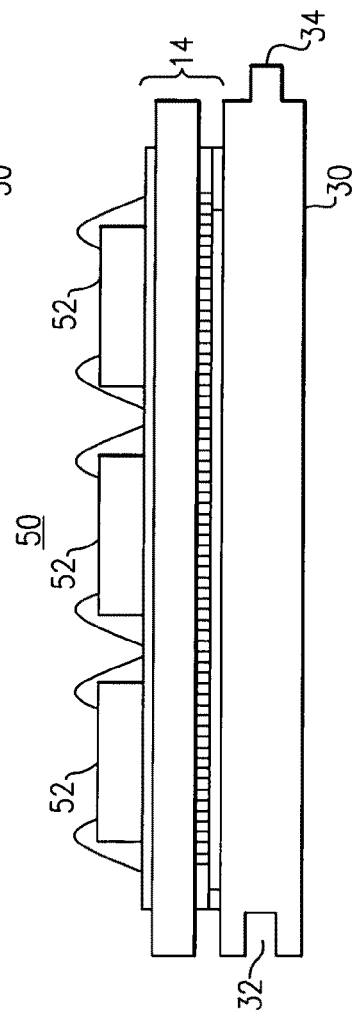
FIG. 9 illustrates a cooling module that includes the unitary substrate assembly depicted in FIG. 7, the unitary base plate depicted in FIG. 8 and at least one semiconductor power device according to one embodiment.
Figure 10:
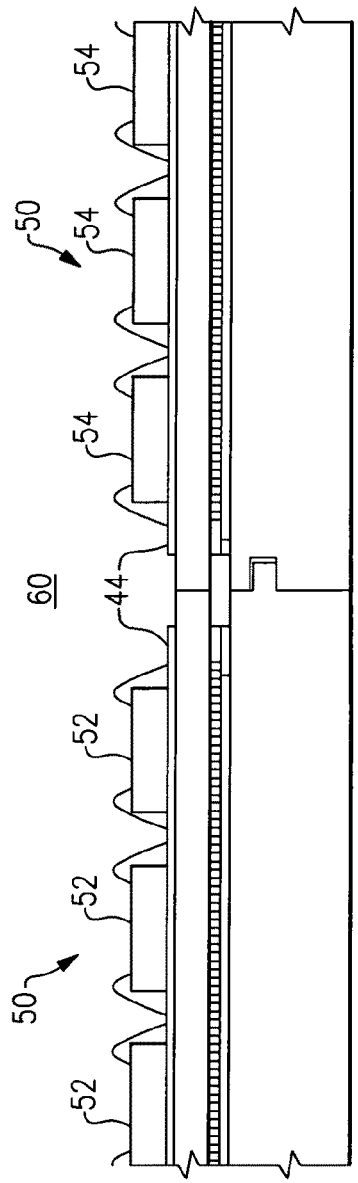
FIG. 10 illustrates a pair of tiled cooling modules according to one embodiment.

FIG. 9 illustrates a cooling module 50 that includes the unitary substrate assembly 14 depicted in FIG. 7, the unitary base plate 30 depicted in FIG. 8 and at least one semiconductor power device 52 according to one embodiment. The inlet port 32 and outlet port 34 are each configured such that a plurality of cooling modules 50 can be tiled together such as illustrated for one embodiment in FIG. 10. The resultant tiled cooling apparatus 60 is suitable for cooling a plurality of semiconductor power devices 52, 54. Each of the outer surfaces 44 is in thermal contact with a respective one of the semiconductor power devices 52, 54. In this manner, the use of several smaller substrates 14 reduces stresses due to coefficient of thermal expansion (CTE) mismatches.

In summary explanation, channel-type cooling assembly embodiments and methods of manufacturing the embodiments have been described with reference to FIGS. 1-10. These embodiments use a high temperature brazing process that avoids contamination or damage to the channels 42 generally associated with soldering techniques. Further, the materials and thicknesses of the substrate layers 16, 22, 24, 26 can be closely controlled to prevent undesired interactions between the layers during heating and cooling processing steps. In this manner, the finer features associated with the corresponding channel layer 24 can be protected from damage during the manufacturing process; and the substrate assembly 14 features can be formed with a high degree of certainty.

The substrate structure 14 is constructed as a single unitary device during a sub-assembly process that includes a ceramic layer 16, a metal layer 22 that is metallurgically bonded to the ceramic layer 16, a channel layer 24 that is metallurgically bonded to the ceramic layer 16, and a manifold layer 26 that is metallurgically bonded to a surface of the channel layer 24. A separate base plate/housing 30 that includes at least one inlet port 32 and at least one outlet port 34 is bonded to a surface 36 of the substrate structure during a final assembly process subsequent to the substrate structure sub-assembly process, and is configured to provide extended manifold layer inlet and outlet ports.

Combining the unitary substrate structure 14 and the unitary base plate 30 during a final assembly stage advantageously avoids contamination or damage to the channels 42 generally associated with soldering techniques as stated above. Since the base plate 30 only functions as a cooling fluid flow means, and does not serve as a heat sink device, the base plate 30 can be formulated from plastic or other non-metallic compounds suitable for bonding the base plate 30 to the substrate structure 14 without the use of solder.

While only certain features of the invention have been illustrated and described herein, many modifications and changes will occur to those skilled in the art. It is, therefore, to be understood that the appended claims are intended to cover all such modifications and changes as fall within the true spirit of the invention.

The invention claimed is:
1. A cooling device comprising:
a substrate assembly comprising:
a ceramic layer comprising a first planar surface and a second planar surface substantially parallel to the first planar surface;
a metal layer bonded to the first planar surface;
a channel layer bonded to the second planar surface; and
a manifold layer bonded to a surface of the channel layer opposite the second planar surface, the ceramic, metal, channel, and manifold layers configured together as a single unitary substrate; and
a discrete plenum housing that is distinct from and bonded to the substrate assembly and configured to provide manifold layer inlet and outlet ports.

2. The cooling device according to claim 1, wherein the metal layer, channel layer and manifold layer each have a thickness of about 0.3 mm.

3. The cooling device according to claim 1, wherein the metal layer has a thickness of about 0.3 mm and the channel layer and manifold layer each have a thickness of about 0.15 mm.

4. The cooling device according to claim 1, wherein the metal layer has a thickness of about 0.6 mm and the channel layer and manifold layer each have a thickness of about 0.3 mm.

5. The cooling device according to claim 1, wherein the channel layer comprises a plurality of channel regions, each channel region having a thickness of about 0.05 mm to about 0.6 mm, the plurality of channel regions configured with a pitch of about 0.2 mm to about 0.8 mm between each channel region.

6. The cooling device according to claim 1, wherein the manifold layer comprises a plurality of inlet manifolds and a plurality of outlet manifolds, wherein the plurality of inlet manifolds are configured to receive a coolant and the plurality of outlet manifolds are configured to exhaust the coolant, and further wherein the plurality of inlet and outlet manifolds are interleaved and are oriented substantially parallel to the first and second planar surfaces.

7. The cooling device according to claim 1, wherein the plenum housing comprises a moldable or castable material.

8. The cooling device according to claim 1, wherein the plenum housing comprises a manifold pattern that replicates the manifold pattern associated with the manifold layer.

9. The cooling device according to claim 1, wherein the substrate layers are bonded together via a high temperature bonding process between about 980° C. and about 1000° C.

10. The cooling device according to claim 1, wherein the substrate layers comprise thermally conductive materials, each having a corresponding thickness and thermal coefficient of expansion configured to prevent structural degradation of the substrate during high temperature bonding between about 980° C. and about 1000° C.

11. The cooling device according to claim 1, wherein the top metal layer comprises a direct bonded copper or an active metal braze structure.

12. The cooling device according to claim 1, wherein the bond between the plenum housing and the substrate assembly is a solderless bond.

13. The cooling device according to claim 1, wherein the ceramic layer is selected from aluminum-oxide ($AL_2O_3$), aluminum nitride (AlN), beryllium oxide (BeO) and silicon nitride ($Si3N4$).

14. The cooling device according to claim 1, further comprising at least one semiconductor power device bonded to an outer surface of the metal layer opposite the metal layer surface bonded to the ceramic layer.

15. The cooling device according to claim 1, wherein the substrate assembly and the plenum housing are together configured to be joined together with at least one other like substrate assembly and one other like plenum housing to form a tiled cooling device structure.

16. A method comprising:
   providing a first ceramic substrate;
   bonding a first metal layer to one side of the first ceramic substrate;
   bonding a first side of a first channel layer to an opposite side of the first ceramic substrate;
   bonding a first manifold layer to a second side of the first channel layer opposite the first side of the first channel layer bonded to the first ceramic substrate, such that the first ceramic substrate, first metal layer, first channel layer and the first manifold layer bonded together form a first substrate assembly; and
   bonding a first plenum housing to the first manifold layer of the first substrate assembly.

17. The method according to claim 16, wherein each bond is a high temperature bond between about 980° C. and about 1000° C.

18. The method according to claim 16, wherein said bonding a first plenum housing to the first manifold layer of the first substrate assembly includes bonding a first plenum housing to the first manifold layer of the first substrate assembly via a low temperature bond below about 300° C.

19. The method according to claim 18, further comprising:
   providing a second ceramic substrate;
   bonding a second metal layer to one side of the second ceramic substrate;
   bonding a first side of a second channel layer to an opposite side of the second ceramic substrate; and
   bonding a second manifold layer to a second side of the second channel layer opposite the first side of the second channel layer, such that the second ceramic substrate, second metal layer, second channel layer and the second manifold layer bonded together form a second substrate assembly.

20. The method according to claim 19, wherein each bond is a high temperature bond between about 980° C. and about 1000° C.

21. The method according to claim 19, further comprising bonding a second plenum housing to the second substrate assembly via a low temperature bond below about 300° C.

22. The method according to claim 21, further comprising coupling the first cooling device to the second cooling device to form a single unitary tiled cooling device comprising a single coolant inlet port and a single coolant outlet port.

* * * * *